United States Patent [19]

Park et al.

[11] Patent Number: 5,443,993

[45] Date of Patent: Aug. 22, 1995

[54] METHOD FOR MANUFACTURING A CAPACITOR FOR A SEMICONDUCTOR DEVICE

[75] Inventors: Won-mo Park; Jong-jin Lee, both of Seoul, Rep. of Korea

[73] Assignee: Samsung Electronics Co., Ltd., Suwon, Rep. of Korea

[21] Appl. No.: 347,246

[22] Filed: Nov. 23, 1994

[30] Foreign Application Priority Data

Nov. 24, 1993 [KR] Rep. of Korea ............. 93-25136

[51] Int. Cl.⁶ ......................................... H01L 21/8242
[52] U.S. Cl. ............................................. 437/60; 437/47; 437/52; 437/919; 148/DIG. 14
[58] Field of Search ................. 437/47, 48, 52, 60, 437/919, 228, 49; 148/DIG. 14

[56] References Cited

U.S. PATENT DOCUMENTS

| | | | |
|---|---|---|---|
| 5,061,650 | 10/1991 | Dennison et al. | 437/60 |
| 5,150,276 | 9/1992 | Gonzalez et al. | 437/52 |
| 5,158,905 | 10/1992 | Ahn | 437/48 |
| 5,217,914 | 6/1993 | Matsumoto et al. | 437/52 |
| 5,266,512 | 11/1993 | Kirsch | 437/52 |
| 5,330,614 | 7/1994 | Ahn | 437/60 |
| 5,387,532 | 2/1995 | Hamamoto et al. | 437/919 |
| 5,399,518 | 3/1995 | Sim et al. | 437/52 |

Primary Examiner—Brian E. Hearn
Assistant Examiner—Tuan Nguyen
Attorney, Agent, or Firm—Robert A. Westerlund; Stephen R. Whitt; Charles R. Donohoe

[57] ABSTRACT

A method for manufacturing a capacitor for a semiconductor device, which includes the steps of forming a first conductive layer on a semiconductor substrate, forming a first pattern by patterning the first conductive layer, sequentially forming a second conductive layer and a first material layer on the entire surface of the resultant structure, forming a spacer on the sidewall of the second conductive layer by anisotropic-etching the first material layer, forming a second pattern by partially etching the second conductive layer and the first pattern, using the spacer as an etching mask, forming a third conductive layer on the entire surface of the resultant structure, forming a cylindrical storage electrode by anisotropic-etching the third conductive layer, and removing the spacer.

10 Claims, 8 Drawing Sheets

METHOD FOR MANUFACTURING A CAPACITOR FOR A SEMICONDUCTOR DEVICE

BACKGROUND OF THE INVENTION

The present invention relates to a method for manufacturing a capacitor for a semiconductor device, and more particularly, to a method for manufacturing a capacitor for a semiconductor device by which capacitance can be easily increased.

The decrease in cell capacitance accompanying reduction in the memory cell area is a serious hindrance to increasing the cell packing density of a dynamic random access memory (DRAM), as it causes a degraded readout capability and an increase in the soft error rate of a memory cell and consumes excessive power during low voltage operation. Thus, it is necessary to increase cell capacitance commensurately with increases in the cell packing density.

Generally, in a highly integrated DRAM (e.g., 64 Mb) employing a two-dimensionally structured, stacked memory cell, sufficient cell capacitance cannot be obtained even though a high dielectric constant material, e.g., tantalum pentoxide ($Ta_2O_5$), is used. Therefore, stacked capacitors having a three-dimensional structure have been proposed to increase cell capacitance, e.g., the double-stacked, fin, spread-stacked, and cylindrical electrode structures have all been proposed.

Since both the outer and inner electrode surfaces can be utilized as an effective capacitor area, the cylindrical three-dimensional structure, in particular, has been recognized as the most suitable for an integrated memory cell circuit which is 64 Mb or higher in capacity. However, the simple cylindrical structure cannot provide sufficient cell capacitance for an integrated memory cell device which is 256 Mb or higher in capacity. Therefore, various new structures have been proposed to increase cell capacitance by improving the cylindrical structure.

The CROWN cell structure, suggested by Toru Kaga in 1991, increases the cell capacitance by forming the cylindrical electrode as a crown-shaped electrode having a double-wall structure (see IEEE Transactions on Electron Device '91, "Crown-Shaped Stacked-Capacitor Cell for 1.5 V Operation 64 Mb DRAMs").

However, the CROWN cell has a disadvantage in that it cannot maximize capacitance because i-line (365 nm) exposure technology used in the manufacturing process of conventional 64 Mb DRAMs cannot reduce the distance between neighboring capacitors of about $0.8 \times 1.6$ $\mu m^2$ cell size to 0.2 $\mu m$ (the limitation imposed by the i-line photolithographic technology) or below.

The present inventors (Ahn et al.) have developed a novel method for manufacturing a capacitor to overcome the above-described disadvantages of the conventional techniques, which novel method is disclosed in Korean patent application No. 93-5901, the disclosure of which is herein incorporated by reference.

FIGS. 1 to 3 are sectional views depicting successive steps of the Ahn et al. method for manufacturing a capacitor.

Referring to FIG. 1, after forming a pair of transistors commonly sharing a drain region 6 and a bit line 11 connected thereto, and each having a source region 4 and a gate electrode 8, on an active region of a semiconductor substrate 1 disposed between adjacent field oxide layers 2, an insulating layer 13 for insulating the transistor is formed on the entire surface of the resultant structure. Subsequently, after forming a planarizing layer 15 for planarizing the surface of the substrate 1 on the resultant structure, silicon nitride and oxide layers are sequentially deposited thereon, thereby forming an etch-blocking layer 17 and a first material layer 29. Next, after forming contact holes by etching the resultant structure over source regions 4, a first conductive layer 50 is formed by depositing an impurity-doped polycrystalline silicon by a chemical vapor deposition (CVD) method. Subsequently, after forming second and third material layers by sequentially depositing oxide and polycrystalline silicon layers on the entire surface of the resultant structure by a CVD process, a first pattern 55 for forming cylindrical electrodes is formed by patterning the third material layer by means of a photo-etching process. Thereafter, a low-temperature oxide is deposited on the entire surface of the resultant structure by a CVD method and is etched anisotropically, thereby forming spacers 46 on the sidewalls of the first pattern 55. Next, the second material layer is etched along with the third material layer excluding the bottom portion 48a of the first pattern 55.

Referring to FIG. 2, after etching the first conductive layer 50 by performing an anisotropic etching process, using spacer 46 as an etching mask and first material layer 29 as an etching end-point detecting layer (whereby the first pattern is also removed), the remnant of the second material layer is removed by an anisotropic etching process. At this time, the first material layer 29 is overetched, such that voids may be produced after the subsequent process of forming the plate electrode. Then, an impurity-doped polycrystalline silicon layer is deposited on the entire surface of the resultant structure by a CVD method, thereby forming a second conductive layer which is etched anisotropically to thereby form cylindrical electrodes 52a and 52b on both sidewalls of the spacers 46.

Referring to FIG. 3, spacers 46 and first material layer 29 are removed by a wet etching process, thereby forming storage electrodes 200 having a double cylindrical structure. Subsequently, dielectric layer 210 and plate electrode 220 are sequentially formed on the entire surface of the storage electrode 200, thereby completing capacitors C1 and C2.

According to the novel method for manufacturing a capacitor as described above, an internal cylindrical electrode is formed utilizing a real mask pattern for forming the storage electrode, and an outer cylindrical electrode is formed in self-aligned fashion with respect to the internal cylindrical electrode. Therefore, the distance between neighboring capacitors can be reduced to a smaller value than the limitation imposed by photolithographic technology. However, as shown in FIG. 2, if the first material layer is over-etched, voids may be generated after the plate electrodes are formed, which results in degraded reliability of the memory cells.

Based on the above, it can be appreciated that there presently exists a need in the art for a method for manufacturing a capacitor which overcomes the shortcomings of the present inventors' above-described previously proposed method. The present invention fulfills this need.

SUMMARY OF THE INVENTION

Therefore, it is an object of the present invention to provide a method for manufacturing a capacitor for a semiconductor device by which capacitance can be easily increased.

It is another object of the present invention to provide a method for manufacturing a capacitor which enhances the reliability of the semiconductor device of which it is part.

The present invention encompasses a method for manufacturing a capacitor for a semiconductor device which includes the steps of forming a first conductive layer on a semiconductor substrate; forming a first pattern by patterning the first conductive layer; forming a second conductive layer and a first material layer on the surface of the resultant structure; forming a spacer on the sidewall of the second conductive layer by anisotropic-etching the first material layer; forming a second pattern by partially etching the second conductive layer and the first pattern, using the spacer as an etching mask; forming a third conductive layer on the surface of the resultant structure; forming a cylindrical storage electrode by anisotropic-etching the third conductive layer; and, removing the spacer.

According to the present invention, the number of deposition steps for forming the storage electrodes of a capacitor is reduced. Also, since an etching end-point detecting layer is used during the etching process, the generation of stringers due to overetching is prevented.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE INVENTION

Figure 1:
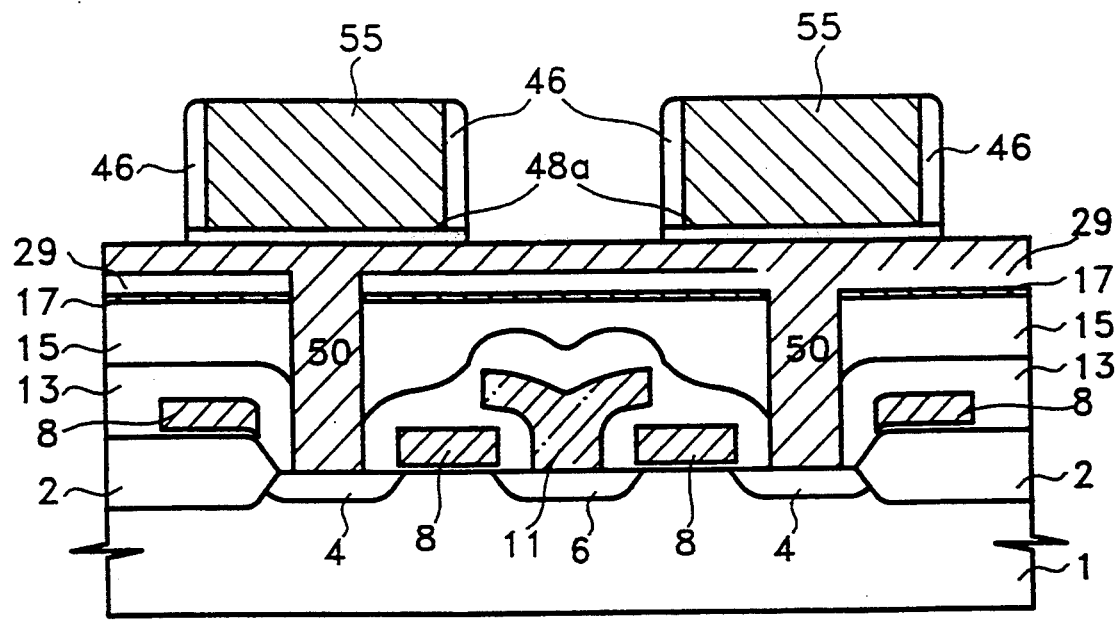
FIGS. 1-3 are sectional views depicting successive steps of a novel method for manufacturing a capacitor for a semiconductor device previously proposed by the present inventors.
Figure 2:
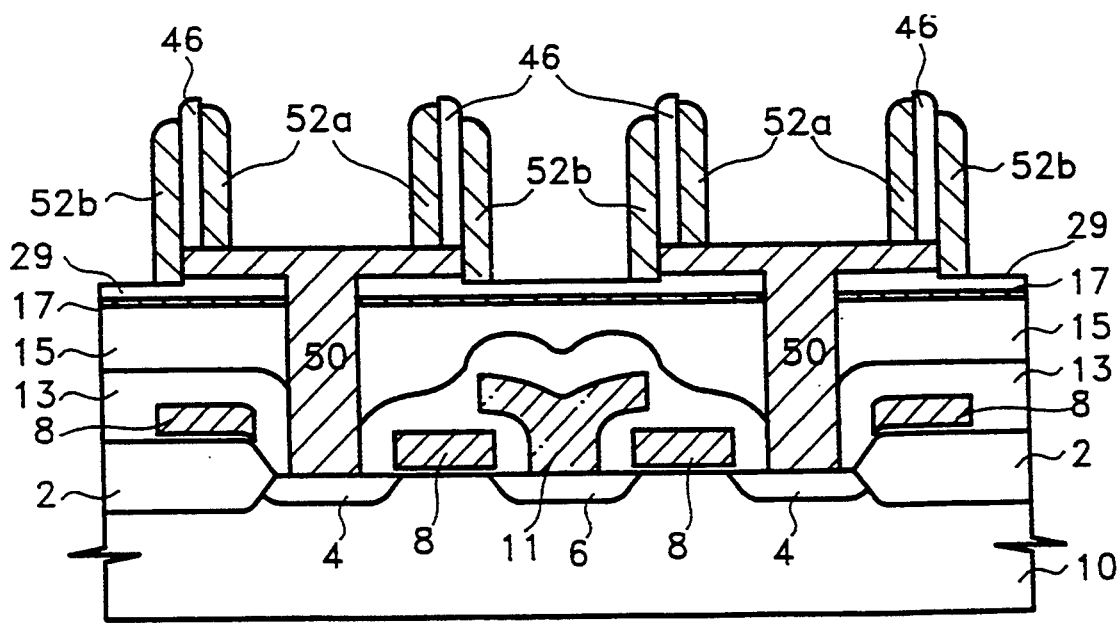
Figure 3:
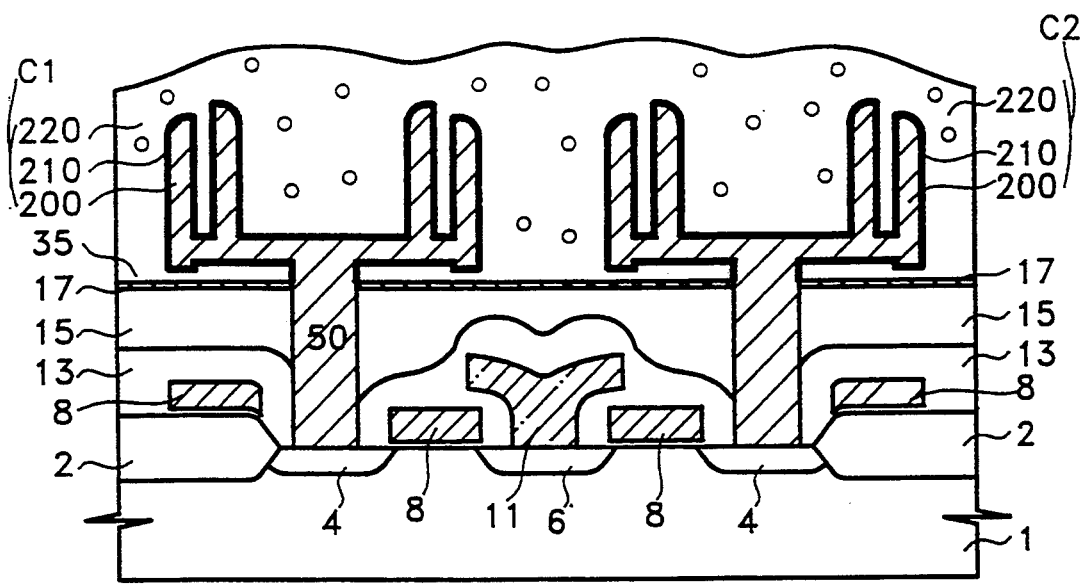
Figure 4:
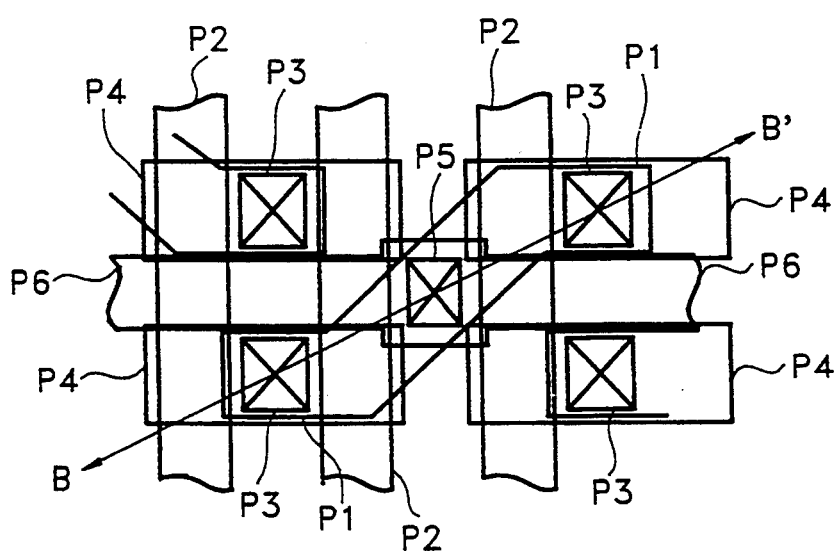
FIG. 4 is a plan view depicting a method for manufacturing a capacitor for a semiconductor device according to a preferred embodiment of the present invention.

Referring to FIG. 4, P1 represents a mask pattern for forming a device isolation region on a semiconductor substrate, P2 represents a mask pattern for forming a gate electrode, P3 represents a mask pattern for forming a contact hole to connect a storage electrode to a source region of a transistor, P4 represents a mask pattern for forming a storage electrode, P5 represents a mask pattern for forming a contact hole to connect a bit line to the drain region of a transistor, and P6 represents a mask pattern for forming a bit line.

FIGS. 5 to 8 are sectional views depicting successive steps of a method for manufacturing a capacitor for a semiconductor device according to a first embodiment of the present invention.

Figure 5:
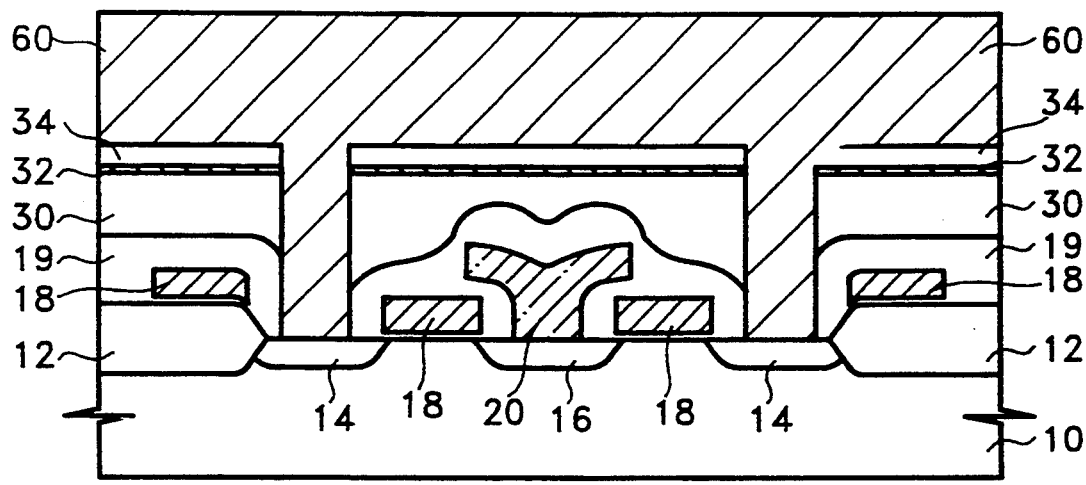
FIGS. 5-8 are sectional views depicting successive steps of a method for manufacturing a capacitor for a semiconductor device according to a first embodiment of the present invention.

With reference now to FIG. 5, the method according to the first embodiment of the present invention includes the steps of forming a planarizing layer 30, an etch-blocking layer 32, a sacrificial layer 34 and a first conductive layer 60 on a semiconductor substrate 10 on which transistors are formed.

The transistors share a common drain region 16 having a bit line 20 connected thereto, and each have a source region 14 and a gate electrode 18, formed on an active region of the semiconductor substrate 10 disposed between adjacent field oxide layers 12. An insulating layer 19 for insulating the transistors is formed on the entire surface of the semiconductor substrate 10. Subsequently, a planarizing layer 30 for planarizing the surface of the insulating layer 19 is formed. Then, insulating materials, e.g., 50-300Å of silicon nitride and 500-2,000Å of oxide, are sequentially deposited on the planarizing layer 30, thereby forming an etch-blocking layer 32 and a sacrificial layer 34. The material constituting the etch-blocking layer 32 preferably has a different etch rate from that of the material constituting the sacrificial layer 34 with respect to a wet etching process. (For example, when the etch rate of one material is set to one, the etch rate of the other material is preferably over four). Also, the material constituting the sacrificial layer 34 preferably has a different etch rate from that of the material constituting first conductive layer 60, with respect to an anisotropic etching process. Subsequently, sacrificial layer 34, etch-blocking layer 32, planarizing layer 30 and insulating layer 19 laminated on source regions 14 are removed using the mask pattern P3 shown in FIG. 4, thereby forming contact holes for facilitating electrical connection of the storage electrodes to the source regions 14. Next, a conductive material, e.g., an impurity-doped polycrystalline silicon, is deposited, e.g., by a CVD method, to a thickness of about 4,000-6,000Å on the entire surface of the resultant structure, thereby forming a first conductive layer 60. The first conductive layer 60 is preferably formed such that the surface thereof becomes planarized when filling the contact holes.

Figure 6:
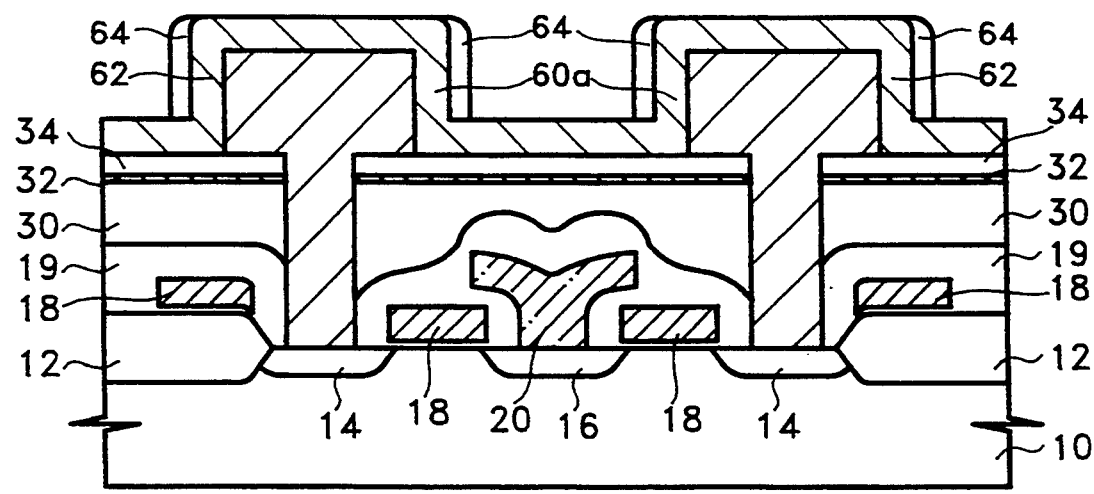

With reference to FIG. 6, the method of the first embodiment of the present invention further includes the steps of forming a first pattern 60a, a second conductive layer 62 and spacers 64. After forming a photoresist pattern (not shown) on the first conductive layer 60 using the mask pattern P4 shown in FIG. 4, the first conductive layer 60 is etched using the photoresist pattern as an etching mask, thereby forming a first pattern 60a which is separated into cell units. Subsequently, the photoresist pattern is removed and impurity-doped polycrystalline silicon and oxide are sequentially deposited on the entire surface of the resultant structure to thicknesses of 500-1,500Å, e.g., by means of a CVD process, thereby forming a second conductive layer 62 and a first material layer (not shown). Next, spacers 64 are formed on the sidewalls of the second conductive layer 62 by anisotropically etching the first material layer. The material constituting the first material layer preferably has a different etch rate from that of the material constituting the second conductive layer 62, with respect to the anisotropic etching process employed. The material constituting the second conductive layer 62 preferably has the same or similar etch rate as that of the material constituting the first conductive layer 60.

Figure 7:
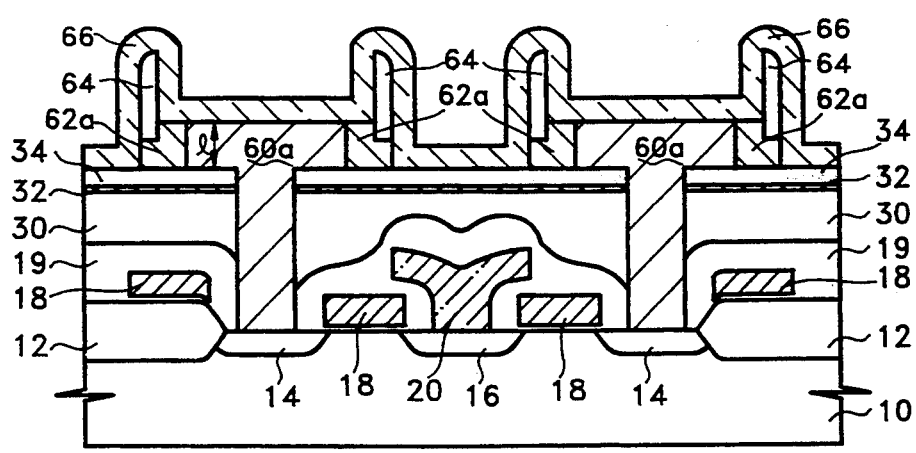

With reference now to FIG. 7, the method of the first embodiment of the present invention further includes the steps of forming second patterns 60a and 62a and a third conductive layer 66. The second conductive layer 62 and the first pattern 60a are etched anisotropically, using the spacers 64 as an etching mask and the sacrificial layer 34 as an etching end-point detection layer, thereby forming a second pattern 62a. In performing the anisotropic-etching process, since the sacrificial layer 34 which has a different etch rate with respect to the first and second conductive layers is used as the etching end-point detection layer, an over-etch is performed, thereby preventing the generation of stringers. The thickness 1 of the second pattern is preferably 1,000–2,000Å. Thereafter, a conductive material whose etch rate is different from that of the material constituting the spacers 64 and is similar to that of the material constituting the second pattern 62a, e.g., an impurity-doped polycrystalline silicon, is deposited, e.g., by a CVD method, to a thickness of 500–1,500Å on the entire surface of the resultant structure, thereby forming a third conductive layer 66.

Figure 8:
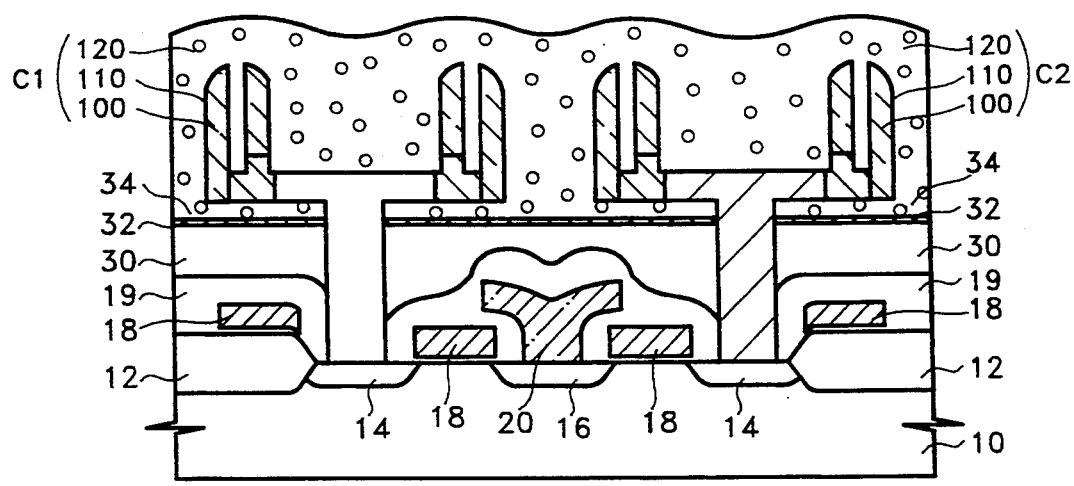

FIG. 8 depicts the final steps for completing capacitors C1 and C2. An anisotropic-etching process is performed on the third conductive layer 66, using the spacers 64 as an etching mask and the sacrificial layer 34 as an etching end-point detection layer, thereby forming double cylindrical electrodes 100 on both sidewalls of the spacers 64. At this time, first and second patterns 60a and 62a are also etched due to their similar etch rate to that of the third conductive layer 66, so that the step difference between the bottoms of the outer cylindrical electrode and inner cylindrical electrode becomes nearly the same. Next, a wet etching process is performed with a surfactant buffered oxide etchant (SBOE), which is a material produced by adding a surface active agent to a mixture of $NH_4F$ and HF, for one to two minutes, to thereby remove spacers 64 and sacrificial layer 34. Then, a dielectric material, e.g., oxide/nitride/oxide (ONO) or $Ta_2O_5$, is deposited on the entire surface of storage electrodes 100, to thereby form dielectric layer 110. Next, a conductive material, e.g., an impurity-doped polycrystalline silicon, is deposited on the entire surface of dielectric layer 110, to thereby form plate electrodes 120. As a result, capacitors C1 and C2, each comprised of storage electrode 100, dielectric layer 110 and plate electrode 120, are completed.

According to the first embodiment of the method of the present invention described above, a storage electrode can be formed by a total of four deposition steps, i.e., three conductive layer deposition steps and one material layer deposition step, thereby simplifying the overall manufacturing process. Also, since the overall etching process is performed using an etching end-point detection layer, the process can be better controlled. Furthermore, since the distance between neighboring capacitors can be reduced to a value smaller than the limitation imposed by photolithographic technology, by adjusting the thickness of the spacers used for forming the cylindrical electrodes, the capacitance of the capacitors can be easily increased.

Figure 9:
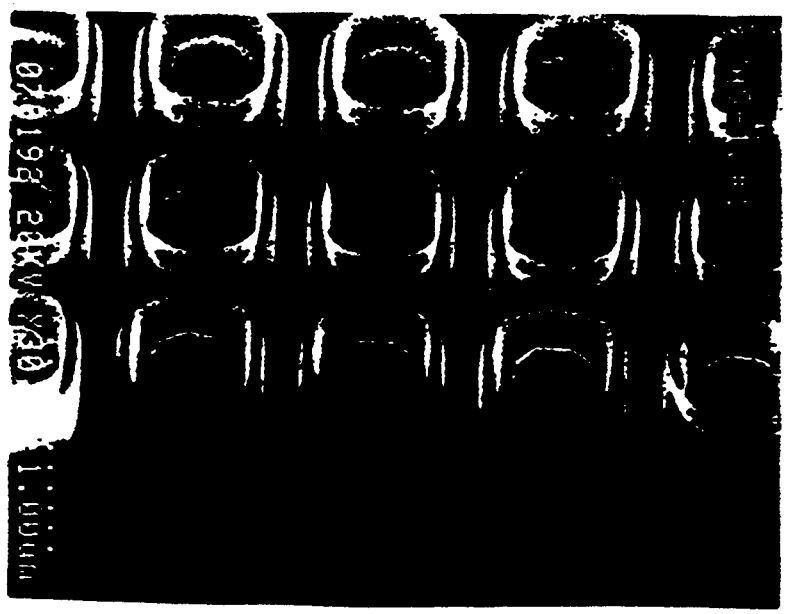
FIG. 9 is a scanning electron microscope (SEM) picture showing a capacitor manufactured according to the first embodiment of the present invention.

FIG. 9 is a SEM picture of capacitors manufactured according to the first embodiment of the present invention.

As shown in FIG. 9, since the capacitors according to the present invention are formed by an etching process using an etching end-point detection layer, an over-etch is allowed, thereby preventing stringers from being generated. Also, the generation of voids is avoided. Therefore, a more reliable capacitor can be obtained.

Figure 10:
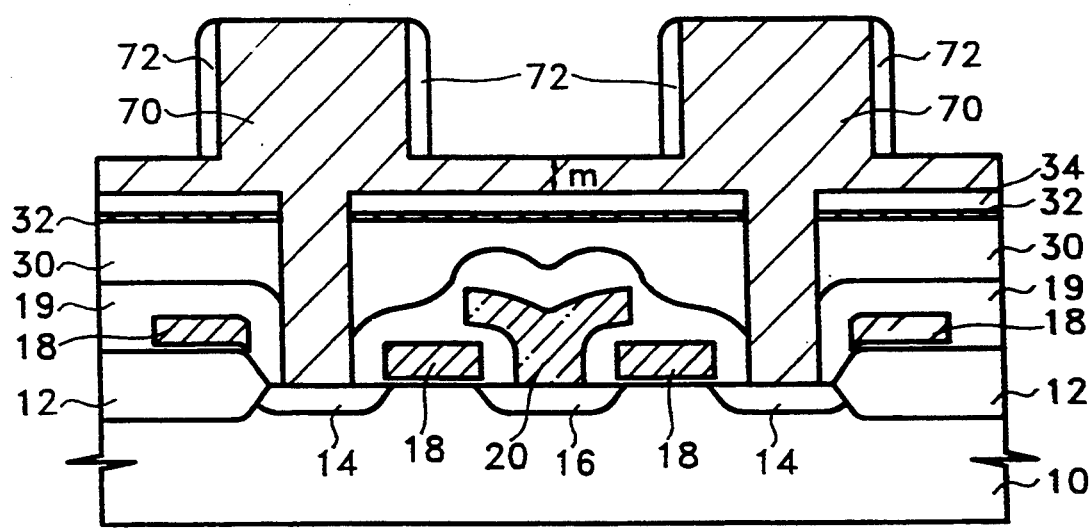
FIGS. 10-12 are sectional views depicting successive steps of a method for manufacturing a capacitor for a semiconductor device according to a second embodiment of the present invention; and, FIGS. 13-16 are sectional views depicting successive steps of a method for manufacturing a capacitor for a semiconductor device according to a third embodiment of the present invention.
Figure 11:
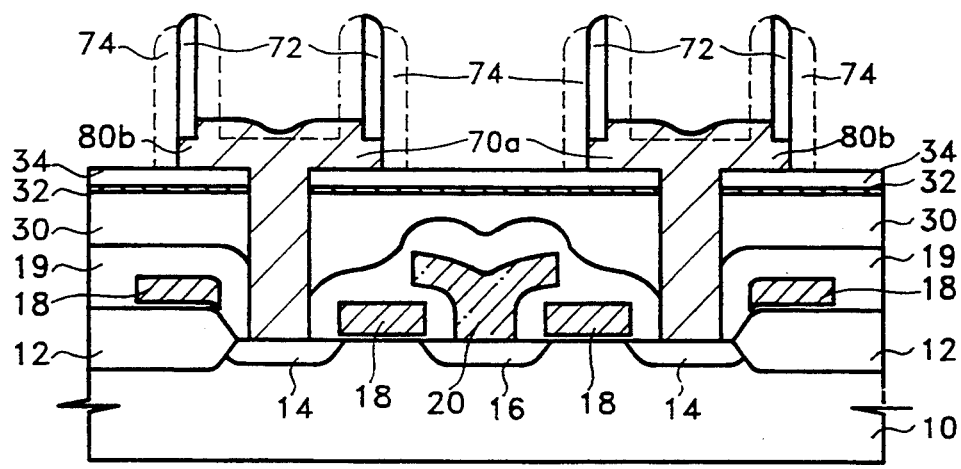
Figure 12:
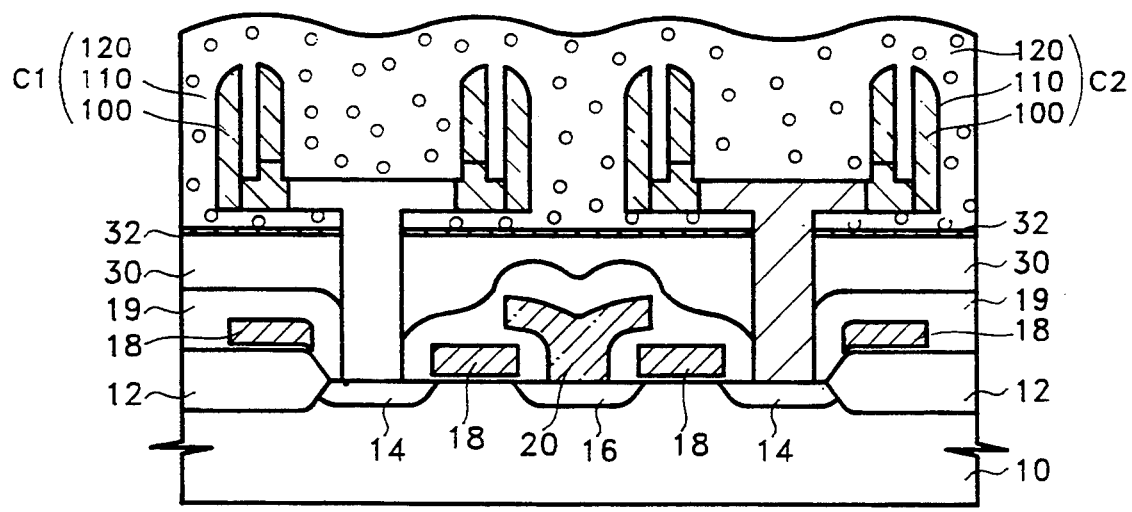

FIGS. 10 to 12 are sectional views depicting successive steps of a method for manufacturing a capacitor for a semiconductor device according to a second embodiment of the present invention.

FIG. 10 depicts the steps of forming a first pattern 70 and spacers 72 on the resultant structure produced by the same previous steps as described hereinabove with reference to FIGS. 5 and 6. More particularly, a conductive material, e.g., an impurity-doped polycrystalline silicon, is deposited on the entire surface of the resultant structure, e.g., by a CVD method, to a thickness of 4,000–6,000Å, thereby forming a first conductive layer. Then, after a photoresist pattern (not shown) is formed on the first conductive layer using mask pattern P4 shown in FIG. 4, the first conductive layer is etched to a predetermined depth using the photoresist pattern as an etching mask, thereby forming a first pattern 70 preferably having thickness m of 500–1,500Å, and having a step portion. Next, the photoresist pattern is removed and a material, e.g., an oxide, having a different etch rate from that of the material constituting the first conductive layer, with respect to an anisotropic etching process, is deposited on the entire surface of the resultant structure, e.g., by a CVD method, to a thickness of 500–1,500Å, thereby forming a first material layer (not shown). Subsequently, the first material layer is etched anisotropically, thereby forming spacers 72 on the sidewalls of the first pattern 70.

FIG. 11 depicts the steps of forming a second pattern 70a and cylindrical electrodes 74. More particularly, the first pattern 70 is etched by performing an anisotropic etching process using the spacers 72 as an etching mask and sacrificial layer 34 as an etching end-point detection layer, thereby forming a second pattern 70a. The thickness of the second pattern 70a is preferably 1,000–2,000Å. Then, a conductive material having a different etch rate from that of the material constituting the spacers 72 and having the same or similar etch rate as that of the material constituting the second pattern 70a, e.g., an impurity-doped polycrystalline silicon, is deposited, e.g., by a CVD method, to a thickness of 500–1,500Å, on the entire surface of the resultant structure, thereby forming a second conductive layer (not shown). Next, the second conductive layer is anisotropically etched, using the sacrificial layer 34 as an etching end-point detection layer, thereby forming double cylindrical electrodes 74 on both sidewalls of spacers 72. Then, the second pattern 70a, which preferably has the same or similar etch rate as that of the second conductive layer, is also partially etched, so that the step differences between the bottoms of the outer cylindrical electrode and inner cylindrical electrode become nearly the same.

FIG. 12 depicts the final steps for completing capacitors C1 and C2. More particularly, the spacers 72 and sacrificial layer 34 are removed by performing a wet etching process using SBOE for about one to two minutes, thereby forming storage electrodes 100 each having a double cylindrical electrode. Subsequently, after a dielectric material, e.g., ONO or $Ta_2O_5$, is coated to form a dielectric layer 110 on the entire surface of the storage electrodes 100, a conductive material, e.g., an impurity-doped polycrystalline silicon, is deposited on the entire surface of the dielectric layer 110, thereby forming plate electrodes 120. As a result, capacitors C1 and C2 each having a storage electrode 100, dielectric layer 110 and plate electrode 120, are completed.

According to the above-described second embodiment of the present invention, the number of deposition steps of conductive layers is reduced to two, thereby greatly simplifying the process according to the first embodiment.

FIGS. 13 to 16 are sectional views which depict successive steps of a method for manufacturing a capacitor for a semiconductor device according to a third embodiment of the present invention.

Figure 13:
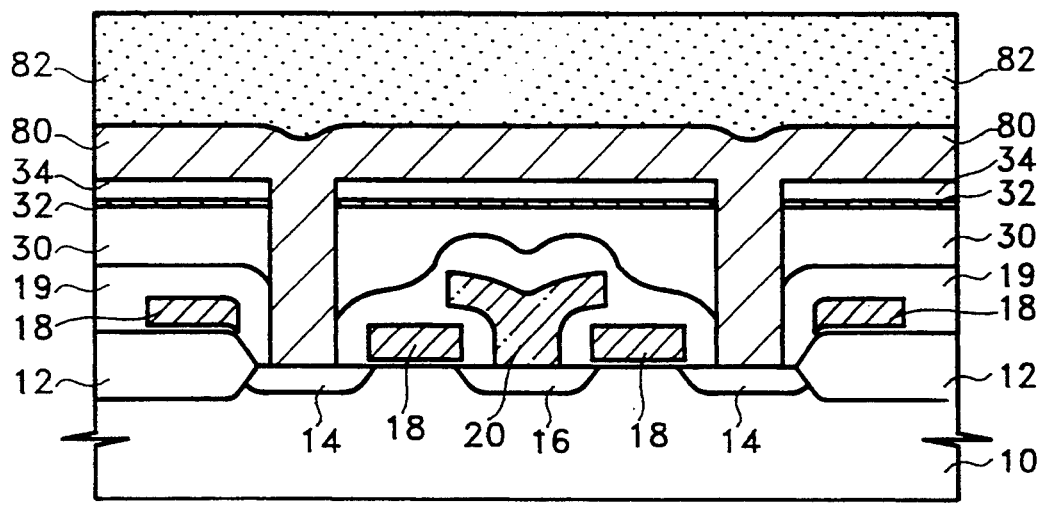

FIG. 13 depicts the steps of forming a first conductive layer 80 and a first material layer 82 on the resultant structure produced by the same previous steps as described hereinabove with reference to FIGS. 5 and 6. More particularly, a conductive material, e.g., an impurity-doped polycrystalline silicon, is deposited on the entire surface of the resultant structure, e.g., by a CVD method, to a thickness of 500–2,000Å, thereby forming a first conductive layer 80. Thereafter, tungsten is deposited on the first conductive layer 80, e.g., by a CVD method, to a thickness of 3,000–7,000Å, thereby forming a first material layer 82, which is preferably constituted of a material having a different etch rate from that of the material constituting the first conductive layer 80, with respect to an anisotropic etching process. In this embodiment, tungsten was used as the material constituting the first material layer 82, and polycrystalline silicon was used as the material constituting the first conductive layer 80.

Figure 14:
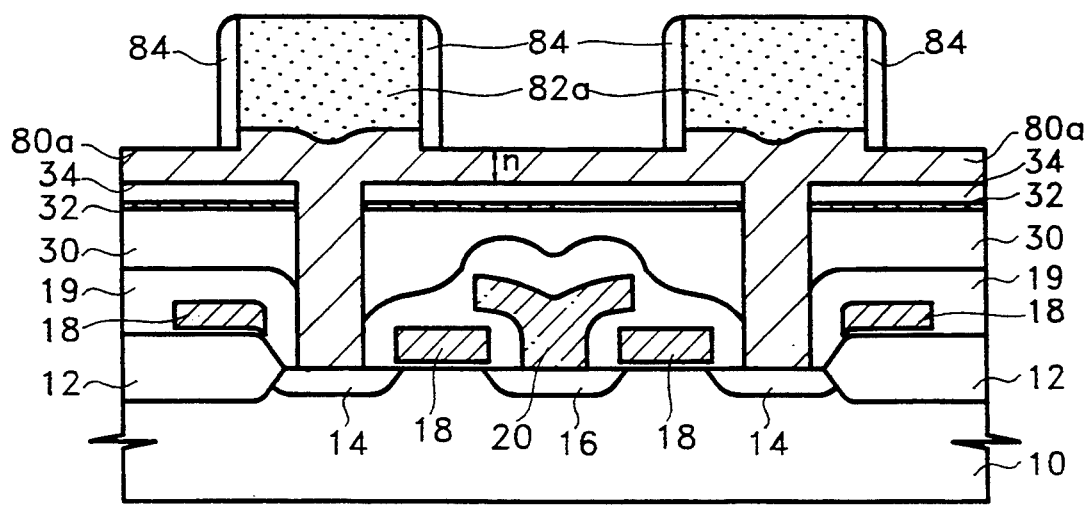

FIG. 14 depicts the steps of forming a first pattern 82a and spacers 84. More particularly, the first material layer 82 is patterned using mask pattern P4 shown in FIG. 4, thereby forming a first pattern 82a which is separated into cell units. At this time, the first conductive layer 80a is also partially etched, the residual portion of the first conductive layer 80a preferably having a thickness n of about 500–1,500Å. Next, a material, e.g., an oxide, having a different etch rate from that of the materials constituting the first material layer 82 and the first conductive layer 80a, with respect to an anisotropic etching process, is deposited on the entire surface of the resultant structure, e.g., by a CVD method, to a thickness of 500–1,500Å, thereby forming a second material layer (not shown). Thereafter, the second material layer is etched anisotropically, thereby forming spacers 84 on the sidewalls of the first pattern 82a and the first conductive layer 80a.

Figure 15:
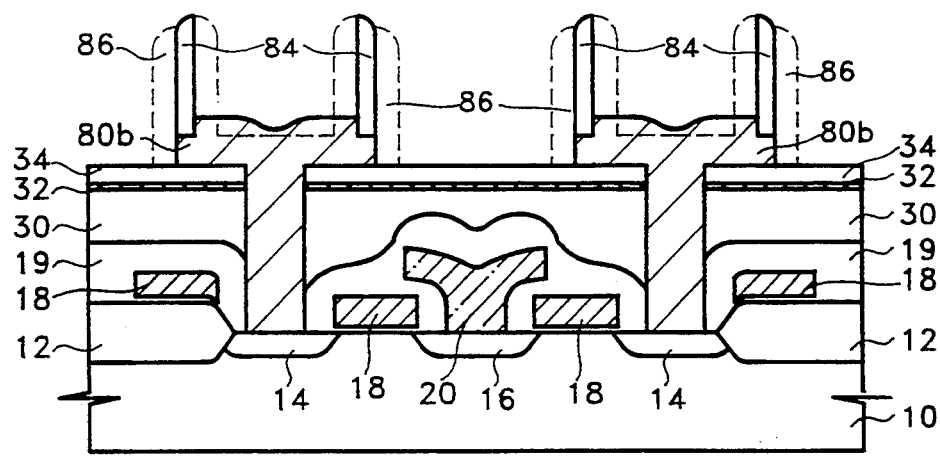

FIG. 15 depicts the steps of forming a second pattern 80b and cylindrical electrodes 86. More particularly, the conductive layer 80a is anistropically etched, using spacers 84 as an etching mask and sacrificial layer 34 as an etching end-point detection layer. Thereafter, the first pattern 82a is removed by performing an isotropic etching process, using the first conductive layer 80a as an etching end-point detection layer, e.g., by a wet etching process using $H_2O_2$ (the etch rate of tungsten with respect to $H_2O_2$ being 170–350Å per minute), thereby forming a second pattern 80b. Next, a material having a different etch rate from that of the material constituting spacers 84, with respect to an anisotropic etching process, e.g., an impurity-doped polycrystalline silicon, is deposited, e.g., by a CVD method, to a thickness of about 500–1,500Å, on the entire surface of the resultant structure, thereby forming a second conductive layer (not shown). Subsequently, an anisotropic etching process is performed with respect to the whole surface of the resultant structure, using the second conductive layer as a target to be etched and spacers 84 and sacrificial layer 34 as an etching end-point detection layer, thereby forming double cylindrical electrodes 86 composed of the second conductive layer on both sidewalls of spacers 84. At this time, the second pattern 80b, which preferably has the same or similar etch rate as that of the second conductive layer, is also partially etched, so that the step differences between the bottoms of the outer cylindrical electrode and inner cylindrical electrode become nearly the same.

Figure 16:
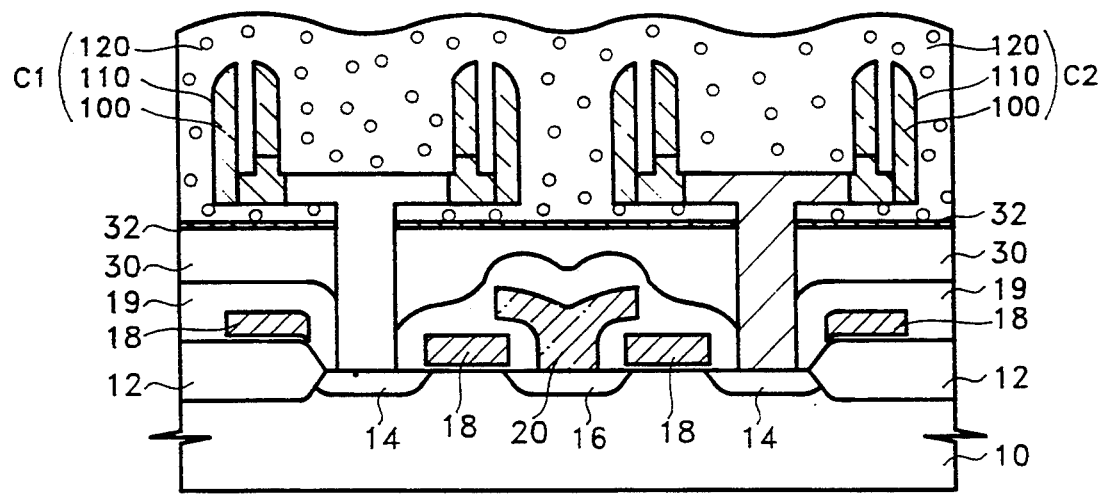

FIG. 16 depicts the final steps for completing capacitors C1 and C2. More particularly, the spacers 84 and sacrificial layer 34 are removed by performing a wet etching process using SBOE, with respect to the entire surface of the resultant structure whereon the cylindrical electrodes 86 are formed, for about one to two minutes, thereby forming storage electrodes 100 each having a double cylindrical structure. Subsequently, a dielectric material is coated on the entire surface of the storage electrodes 100, to thereby form a dielectric layer 110. Thereafter, an impurity-doped polycrystalline silicon is deposited on the entire surface of the dielectric layer 110, to thereby form plate electrodes 120. As a result, capacitors C1 and C2 each composed of a storage electrode 100, dielectric layer 110 and plate electrode 120, are completed.

According to the third embodiment of the present invention described above, in order to solve process control problems which may be caused by etching first conductive layer by the adjustment of the etching time of the second conductive layer, the first pattern is formed of tungsten having a different etch rate with respect to the first conductive layer, thereby achieving excellent process control.

Therefore, according to the present invention as described above, the number of deposition steps of conductive layers and material layers for forming storage electrodes of a capacitor is reduced, thereby simplifying the process. Also, since the etching process is performed utilizing an etching end-point detection layer, the generation of stringers in the conductive layers can be prevented, thereby enabling the manufacture of reliable capacitors for a semiconductor device. Furthermore, since the distance between neighboring capacitors can be reduced to a value less than the limitations imposed by the photolithographic technology by adjusting the thickness of the spacers used in forming cylindrical electrodes, the capacitance of the capacitors can be easily increased.

Although three different embodiments of the present invention have been described in detail hereinabove, it should be clearly understood that many variations and-/or modifications thereof which may appear to those skilled in the art will still fall within the spirit and scope of the present invention as defined in the appended claims.

What is claimed is:

1. A method for manufacturing at least one capacitor for a semiconductor device including a semiconductor substrate having a multi-layer gate and insulation structure formed thereon, comprising the steps of:

forming a first conductive layer on the gate and insulation structure, said first conductive layer including a portion extending through a contact hole provided in the gate and insulation structure to thereby electrically connect said first conductive layer with an active region of a transistor formed in the substrate;

forming a first pattern by patterning said first conductive layer;

forming a second conductive layer on said first pattern and exposed portions of the gate and insulation structure;

forming a first material layer on said second conductive layer;

forming a spacer on a sidewall of said second conductive layer by anisotropically etching said first material layer;

forming a second pattern by etching said second conductive layer and said first pattern using said spacer as an etching mask;

forming a third conductive layer on said second pattern and exposed portions of the gate and insulation structure;

forming a cylindrical storage electrode by anisotropically etching said third conductive layer; and, removing said spacer.

2. The method as set forth in claim 1, wherein said first material layer is constituted of a first material having an anistropic etch rate that is different from that of a second material constituting said second and third conductive layers.

3. The method as set forth in claim 2, wherein said first material comprises an oxide, and said second material comprises polycrystalline silicon.

4. The method as set forth in claim 3, further comprising the steps of:

forming a dielectric layer on the resultant structure produced by the preceding steps; and, forming a fourth conductive layer on said dieletric layer.

5. The method as set forth in claim 1, further comprising the steps of:

forming a dielectric layer on the resultant structure produced by the preceding steps; and, forming a fourth conductive layer on said dieletric layer.

6. The method as set forth in claim 1, wherein the gate and insulation structure includes a sacrificial layer on the upper surface thereof.

7. The method as set forth in claim 6, wherein said forming a second pattern and said forming a cylindrical storage electrode steps are each performed by using said spacer as an etching mask and said sacrificial layer as an etching end-point detection layer.

8. The method as set forth in claim 7, wherein the gate and insulation structure further includes an etch-blocking layer disposed underneath said sacrificial layer.

9. The method as set forth in claim 8, wherein said etch-blocking layer is comprised of silicon nitride and said sacrificial layer is comprised of an oxide.

10. The method as set forth in claim 9, further comprising the step of removing said sacrificial layer.

* * * * *